US009728660B2

(12) United States Patent
Curry et al.

(10) Patent No.: US 9,728,660 B2
(45) Date of Patent: Aug. 8, 2017

(54) OPTICALLY-TRIGGERED LINEAR OR AVALANCHE SOLID STATE SWITCH FOR HIGH POWER APPLICATIONS

(71) Applicant: The Curators of the University of Missouri, Columbia, MO (US)

(72) Inventors: Randy D. Curry, Columbia, MO (US); Heikki Helava, Dix Hills, NY (US)

(73) Assignee: The Curators of the University of Missouri, Columbia, MO (US)

( * ) Notice: Subject to any disclaimer, the term of this patent is extended or adjusted under 35 U.S.C. 154(b) by 166 days.

(21) Appl. No.: 14/421,404

(22) PCT Filed: Aug. 14, 2013

(86) PCT No.: PCT/US2013/054967
§ 371 (c)(1),
(2) Date: Feb. 12, 2015

(87) PCT Pub. No.: WO2014/070281
PCT Pub. Date: May 8, 2014

(65) Prior Publication Data
US 2015/0187970 A1    Jul. 2, 2015

Related U.S. Application Data

(60) Provisional application No. 61/683,188, filed on Aug. 14, 2012.

(51) Int. Cl.
*H01L 31/00*    (2006.01)
*H01L 31/0304*    (2006.01)
*H01L 31/09*    (2006.01)
*H01L 31/107*    (2006.01)
*H03K 17/78*    (2006.01)
*H01Q 3/26*    (2006.01)

(52) U.S. Cl.
CPC .. *H01L 31/03044* (2013.01); *H01L 31/03048* (2013.01); *H01L 31/09* (2013.01); *H01L 31/107* (2013.01); *H01Q 3/2676* (2013.01); *H03K 17/78* (2013.01); *Y02E 10/544* (2013.01); *Y02P 70/521* (2015.11)

(58) Field of Classification Search
CPC ......... H01L 31/03044; H01L 31/03048; H01L 31/09; H01L 31/107; H01Q 3/2676; H03K 17/78; Y02E 10/544; Y02P 70/521
See application file for complete search history.

(56) References Cited

U.S. PATENT DOCUMENTS

| 3,917,943 A | 11/1975 | Auston |
| 4,152,713 A | 5/1979 | Copeland, III et al. |
| 4,329,686 A | 5/1982 | Mourou |
| 4,782,222 A | 11/1988 | Ragle et al. |

(Continued)

OTHER PUBLICATIONS

PCT/US13/54967 International Search Report and Written Opinion mailed Jun. 6, 2014 (17 pages).

*Primary Examiner* — Francis M Legasse, Jr.
(74) *Attorney, Agent, or Firm* — Polsinelli PC

(57) ABSTRACT

The present invention relates to a solid state switch that may be used as in optically-triggered switch in a variety of applications. In particular, the switch may allow for the reduction of gigawatt systems to approximately shoebox-size dimension. The optically-triggered switches may be included in laser triggered systems or antenna systems.

16 Claims, 11 Drawing Sheets

(56) References Cited

U.S. PATENT DOCUMENTS

| | | |
|---|---|---|
| 5,146,075 A | 9/1992 | Kim et al. |
| 5,216,275 A | 6/1993 | Chen |
| 6,061,034 A | 5/2000 | Agee et al. |
| 2002/0043878 A1 | 4/2002 | Podeyn et al. |
| 2002/0071627 A1 | 6/2002 | Smith et al. |
| 2003/0042404 A1 | 3/2003 | Rice et al. |
| 2009/0026967 A1 | 1/2009 | Mazumder et al. |
| 2009/0167453 A1 | 7/2009 | London |
| 2010/0166426 A1 | 7/2010 | Watanabe |
| 2012/0098029 A1 | 4/2012 | Mazumder et al. |
| 2012/0098607 A1 | 4/2012 | Tatoian et al. |
| 2013/0334537 A1 | 12/2013 | Helava et al. |
| 2014/0042581 A1* | 2/2014 | Mheen .............. H01L 31/02002 257/438 |
| 2015/0221804 A1 | 8/2015 | Curry et al. |

\* cited by examiner

Baliga's figure of merit is a well-referenced, geometry-independent comparison of materials for power devices.

*Values depend on concentration of aluminum

| Material | $\mu_n$ (cm²/V-s) | $\mu_p$ (cm²/V-s) | $E_g$ (eV) | $\tau_r$ (s) | $E_c$ (V/cm) | $\varepsilon_r$ | BFoM (rel. to Si) |
|---|---|---|---|---|---|---|---|
| GaAs | 8500 | 400 | 1.42 | $10^{-9}$ | $4 \times 10^5$ | 10.9 | 13.4 |
| Si | 1400 | 450 | 1.12 | $10^{-7}$ | $3 \times 10^5$ | 11.7 | 1 |
| AlGaN* | 300-440 | 14-200 | 3.2-6.0 | $10^{-9}$ | $1.2 – 5 \times 10^6$ | 5.5 | 683.9 |
| GaN | 440 | 200 | 3.2 | $4 \times 10^{-9}$ | $5 \times 10^6$ | 5.3 | 659.1 |
| SiC (4H) | 900 | 120 | 3.23 | $10^{-7}$ | $10^6$ | 9.66 | 19.7 |

$$BFoM = \varepsilon_s \mu_n E_c^3$$

FIG. 5

SiC-(4H)
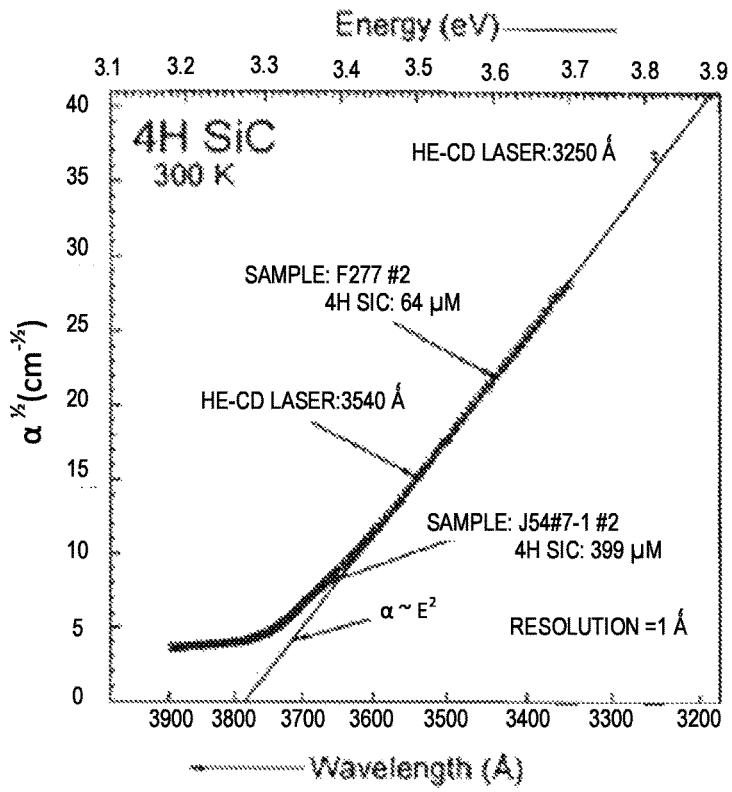
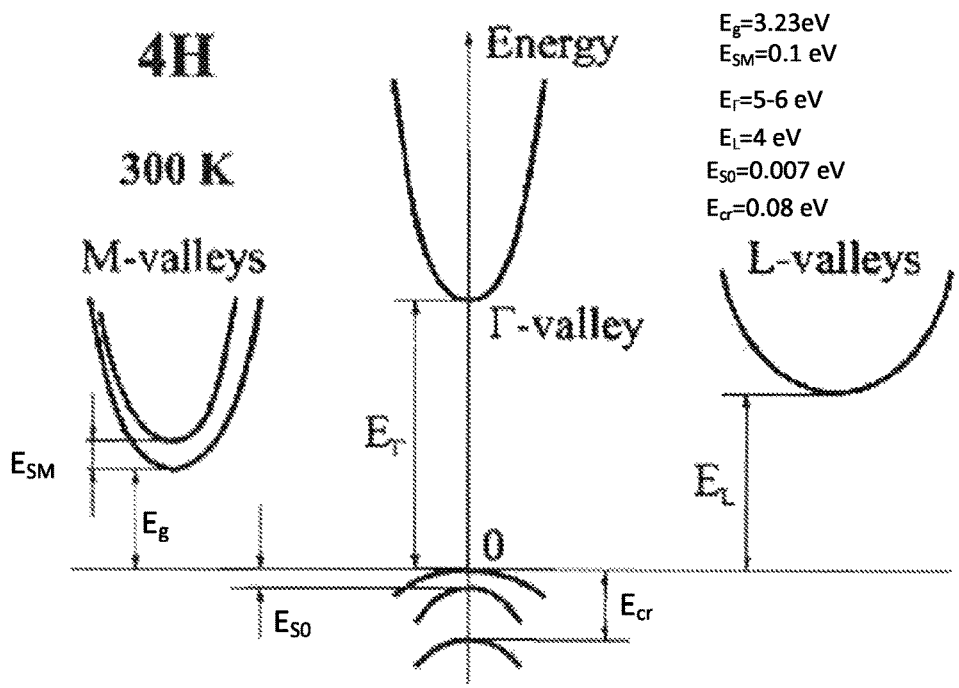
FIG. 6A

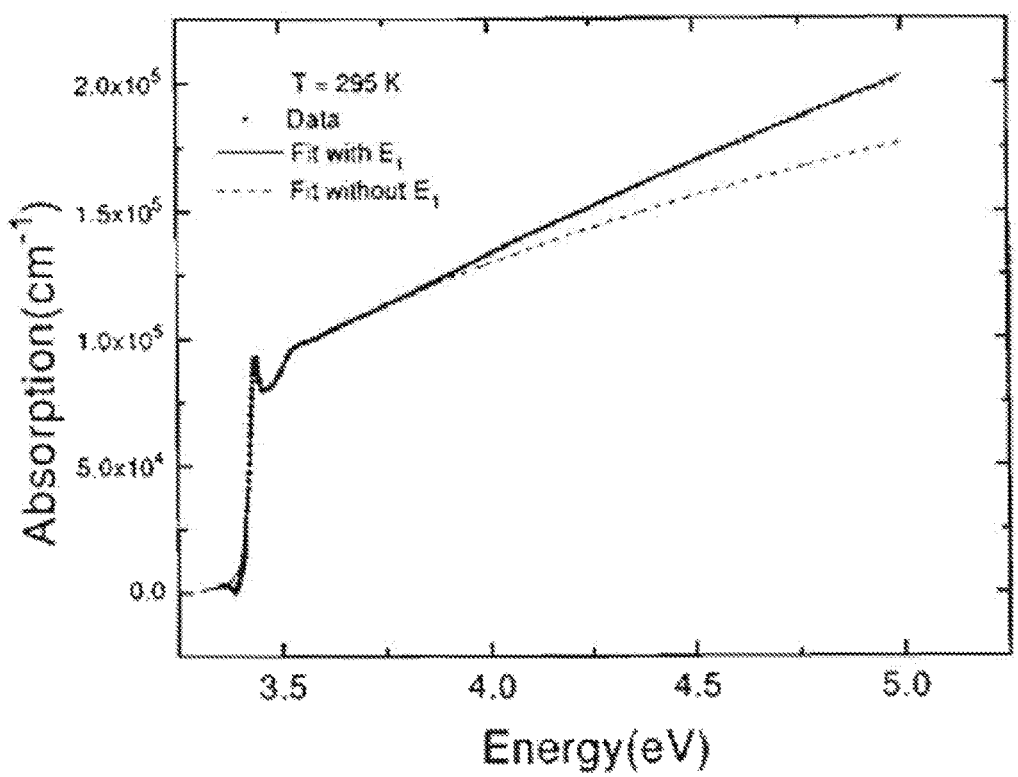
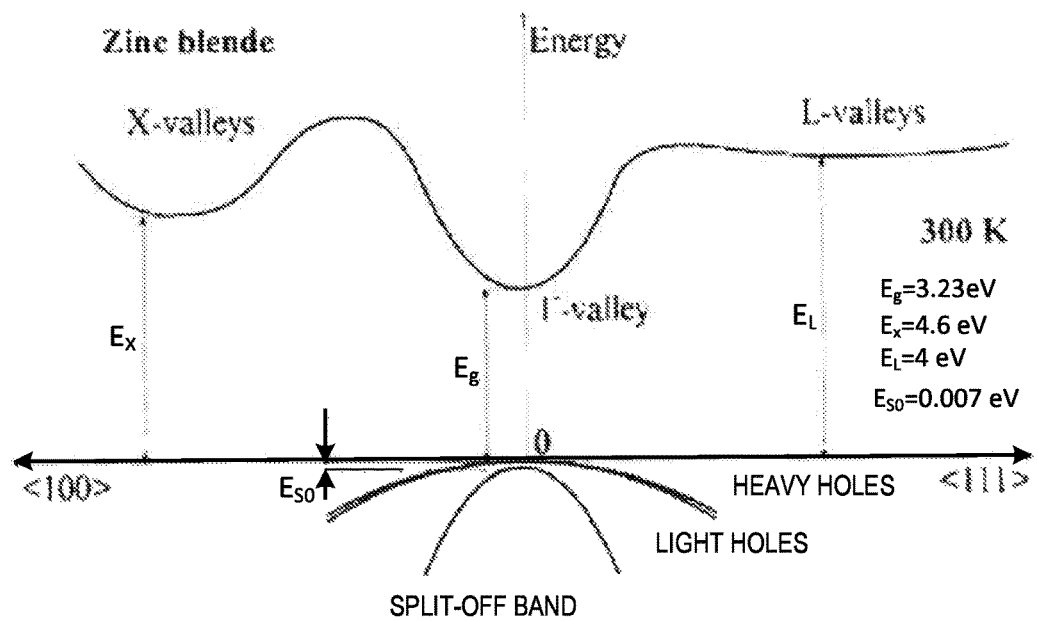
FIG. 6B

OPTICALLY-TRIGGERED LINEAR OR AVALANCHE SOLID STATE SWITCH FOR HIGH POWER APPLICATIONS

CROSS REFERENCE TO RELATED APPLICATIONS

This application claims priority to U.S. Provisional Patent application Ser. No. 61/683,188, filed Aug. 14, 2012, entitled "Optically-triggered Linear or Avalanche Solid State Switch for High Power Applications," which is hereby incorporated by reference in its entirety.

FIELD OF THE INVENTION

The present invention relates to optically-triggered switches used in radio frequency (RF) gigawatt (GW) class high power systems, including high power radar systems and ground penetrating radar systems. In particular, the present invention relates to bulk avalanche semiconductor switches useful for producing high power pulses in RF GW class systems that also operate in the gigahertz frequency range.

BACKGROUND OF THE INVENTION

In the field of high power semiconductor systems, many existing systems tend to be very large, heavy, and cumbersome. One such system is the original GEM System produced by Power Spectra Inc. The GEM system is a gigawatt class, high power microwave system that uses laser triggered switches built with gallium arsenide (GaAs) semiconductors. The GEM system uses an array of bulk avalanche semiconductor switching (BASS) modules that each produced 1 to 2 MW of peak power to achieve a total power output of 1 GW in a 500 MHz-1.5 GHz wideband output scheme. The GEM system is very large and bulky and produces a limited power output relative to many modern high powered systems and technologies. Therefore, a need exists for more compact and robust systems and devices for advanced high power applications.

SUMMARY OF THE INVENTION

The present invention relates to a switch that is optically-triggered avalanche switch based on aluminum gallium nitride (AlGaN) or gallium nitride (GaN). The optically-triggered switch can be used for any high voltage application. A specific example includes use in the generation of RF signals for high power applications. In one embodiment, the optically-triggered switch includes a GaN or AlGaN semiconductor material and a set of conductive contacts deposited on the semiconductor material. One or more grounding electrodes may also be deposited on the semiconductor material. A portion of the semiconductor material separates the one or more grounding electrodes from the conductive set of contacts. The switch may be a horizontally switched structure or a vertically switched structure that incorporates a mesa structure for voltage hold off. A laser beam may be used to illuminate the switching region from a lateral side of the switch or the laser beam may illuminate the switch in a direction perpendicular to a conductive region of the switch. Once the switch is illuminated, the semiconductor material undergoes an avalanche breakdown leading to a highly conductive region that transfers the energy through the switch. The switch may be configured to operate when exposed to a voltage potential in a range from approximately 0.01V to approximately 10 MV. In particular, the switch may be configured to operate when exposed to a voltage potential of approximately 0.01 MV to 10 MV.

The optically-triggered switch is configured for use in a compact high power system to generate a power pulse on the order of kilowatts to gigawatts. In other embodiments, the switch may include AlGaN. Further, systems incorporating the GaN or AlGaN switches may be used as reconfigurable pulse width or frequency agile RF pulse sources. Alternatively, the switch may operate in either a linear mode or an avalanche mode. The switch may be used for accelerator systems or any system requiring a switch that can transition from a nonconductive region to a conductive region on the order of femtoseconds to nanoseconds. Alternatively, the AlGaN or GaN switches can be incorporated into an integrated circuit configured for protecting systems against cyber terrorism or incorporated into power semiconductor devices.

DESCRIPTION OF FIGURES

FIG. 5 is a chart providing Baliga's Figure of Merit for various semiconductor materials according to one embodiment.

FIGS. 6A-B depict the optical absorption for various semiconductor materials according to one embodiment.

DETAILED DESCRIPTION OF THE INVENTION

The present invention relates to optically-triggered semiconductor-based switches and compact and easily transportable systems, including antennas that incorporate the optically-triggered switch, high power radar systems, and ground penetrating radar systems, among others. In various embodiments, the switches are built with Group III nitride semiconductors, including gallium nitride (GaN) or aluminum gallium nitride (AlGaN) solid state semiconductors. The switches may then be incorporated into megawatt to multiple terawatt class high power systems that are up to 100 to 200 times more powerful than existing power systems of the same size that rely on GaAs or silicon based switches and/or other photoconductive switches. Similarly, the switches and systems of the present invention may also produce comparable or greater levels of power within a reduced size.

Figure 1:
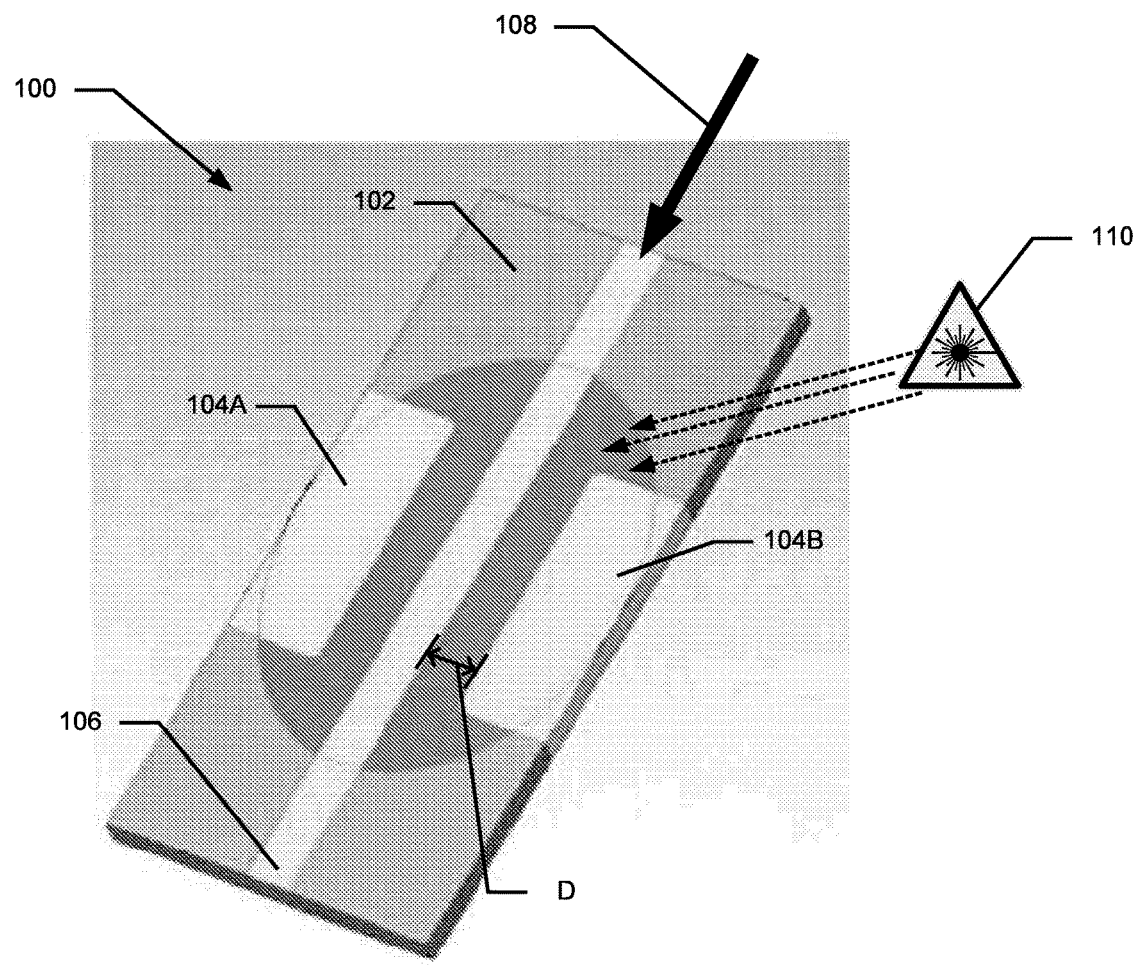
FIG. 1 depicts an optically-triggered switch according to one embodiment.
Figure 3:
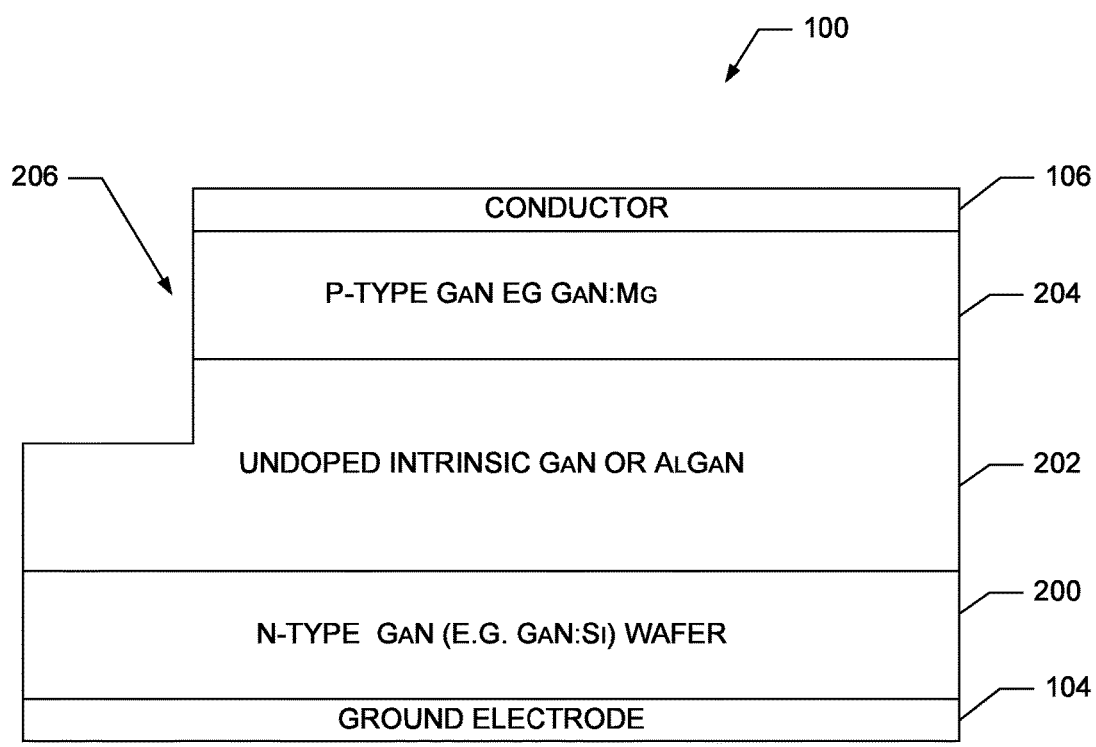
FIG. 3 depicts an optically-triggered vertical switch according to one embodiment.

Referring now to FIG. 1, an embodiment of the optically-triggered switch 100 having a coplanar configuration is shown. The optically-triggered switch 100 includes a GaN wafer 102 consisting of an undoped, intrinsic GaN layer 202 having a thickness in a range between about 30 μm and about 2 cm grown on a substrate 200 having a thickness in a range between about 300 μm and about 1 mm, as shown in FIG. 3. In one embodiment, the GaN layer 202 is grown using any suitable method to a thickness of approximately 50 μm on an approximately 300 μm thick conductive gallium nitride (GaN) substrate 200. Other substrate materials or additional base layers may also be incorporated into the wafer 102.

As shown in FIG. 1, the optically-triggered switch 100 also includes one or more ground plane electrodes 104A-B. The optically-triggered switch 100 also includes a central conductor 106. The central conductor 106 is a microstrip conductor having an impedance in a range between about 0.1Ω and about 1000Ω. Preferably, the conductor 106 has an impedance in the range between about 10Ω and 200Ω.

In various embodiments, the central conductor 106 and the ground plane electrodes 104A-B are spaced to provide a negligible coupling effect. For example, an analysis may be performed to verify the impedance of an input signal by varying the spacing "D" between the conductor 106 and the ground plane electrodes 104A-B while recording the output voltage. In various embodiments, the spacing D may be in a range between about 1 mm and 1 cm. By way of example and not limitation, the spacing D between the conductive contact or conductor 106 and the ground plane electrodes 104A-B may be carefully tailored to ensure minimal impedance variation In operation, an input signal 108 is applied to the conductive contact 106 while the ground plane electrodes 104A-B are held at ground potential. When the optically-triggered switch 100 is illuminated by a laser pulse 110 in a laser illumination region 112, the resistivity of the GaN or AlGaN decreases which forms a low-resistance electrical connection between the conductors and ground plan electrodes 104A-B and 106. As a result, a portion of the input signal 108 is reflected back to the input and a portion of the input signal is shunted to ground. The optically-triggered switch 100, therefore provides dual, parallel current paths to ground (e.g. one to the left ground plane electrode 104A and one to the right ground plane electrode 104B), which decreases the effective channel resistance. In various embodiments, the channel resistance may be reduced to the order of milliohms or micro ohms.

Figure 2:
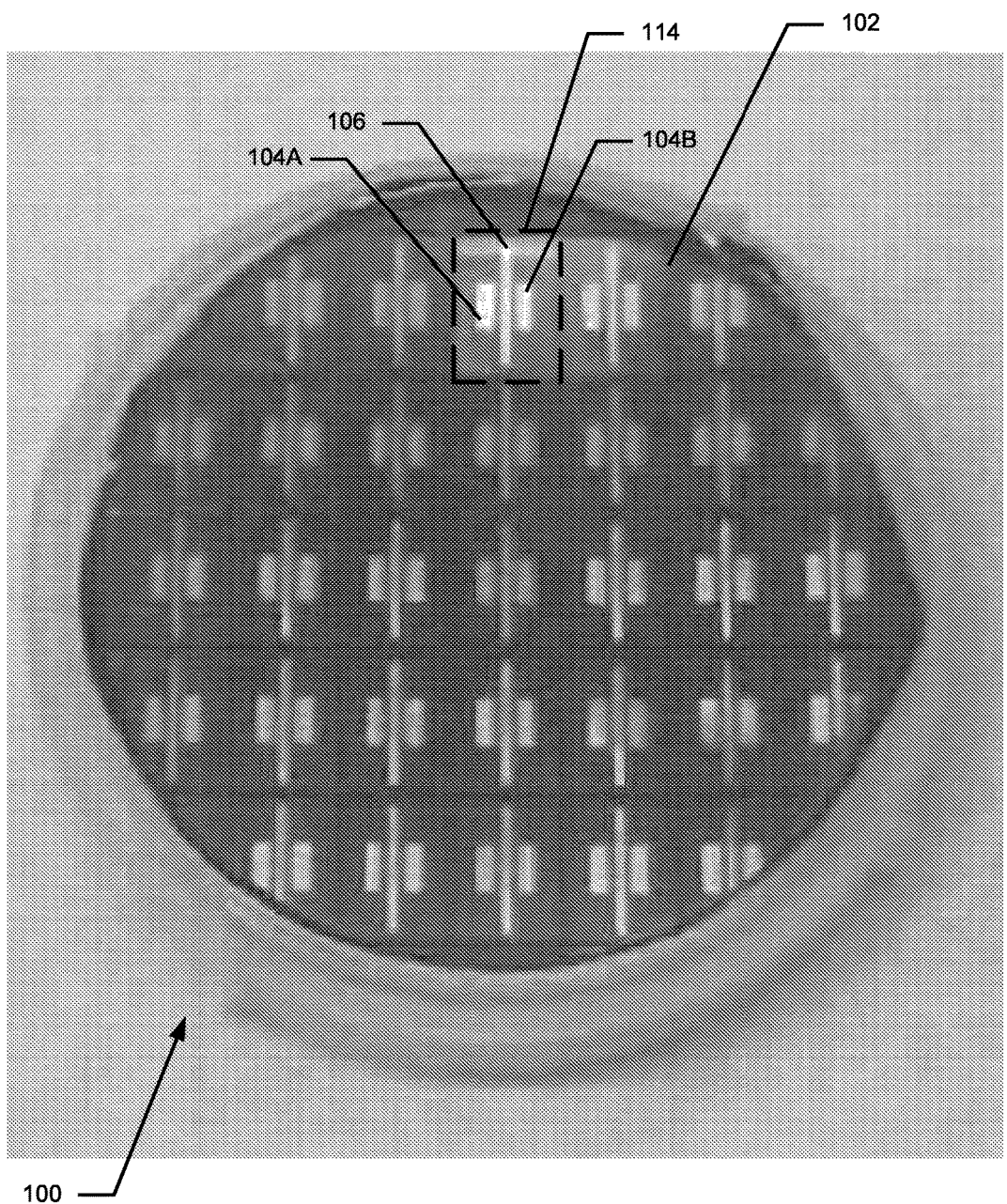
FIG. 2 depicts a semiconductor wafer with a number of optically-triggered switch conductive contacts and electrodes according to one embodiment.

FIG. 2 depicts another embodiment of the optically-triggered switch 100. This embodiment includes an AlGaN wafer 102 that includes multiple conductive contacts 106 and ground plane electrodes 104A-B. The multiple arrangements 114 of conductors 106 and ground plane electrodes 104A-B may be isolated or, alternately, in electrical communication with one another so that an input signal 108 at one conductor 16 may be shared across one or more other conductors. As such, an optical signal, including those generated by a laser or other suitable light source, at one of the arrangements 114 may cause the input signal 108 at another arrangement to be shunted to ground. Alternately, the optical signal may be used as a floating series electrode.

While embodiments of the optically-triggered switch 100 may have a coplanar configuration as shown in FIGS. 1-2. A preferred and potentially more practical configuration is a vertical configuration as shown in FIG. 3, where the switch 100 shorts a conductor 106 on top of the switch through the switch material to a ground plane electrode 104A-B located on a bottom surface of the switch. The vertical configuration of the switch 100 can be operated in the linear mode or in an avalanche mode. The vertically configured switch 100 may include a substrate and one or more semiconductor layers formed on the substrate.

As shown in FIG. 3, one embodiment of the optically-triggered switch 100 includes a substrate 200 and multiple semiconductor layers 202-204 formed on the substrate. The substrate 200 is an n-type doped GaN substrate. In one embodiment, the substrate 200 is a Si-doped conductive GaN wafer approximately 0.3 mm thick and approximately 2 inches in diameter. In other embodiments, the GaN substrate 200 may be doped by other n-type dopants including, but not limited to, germanium. On top of the substrate 200, an intrinsic or undoped layer 202 of GaN or AlGaN is grown. The top layer of the switch 100 is a p-type doped GaN layer 204. In one embodiment, the top layer 204 is doped with magnesium, while in other embodiments, the dopant may be another p-type dopant, including but not limited to zinc. A mesa structure, as indicated by 206, is formed in the switch 100 by any suitable process including etching.

The optically-triggered switch 100, as shown in FIGS. 1-3 may be manufactured using a variety of methods including, but not limited to hydride vapor phase epitaxy (HVPE) growth techniques and chemical vapor deposition (CVD). The switch 100 may also be produced by depositing electrodes on a grown semiconductor crystal.

Figure 4:
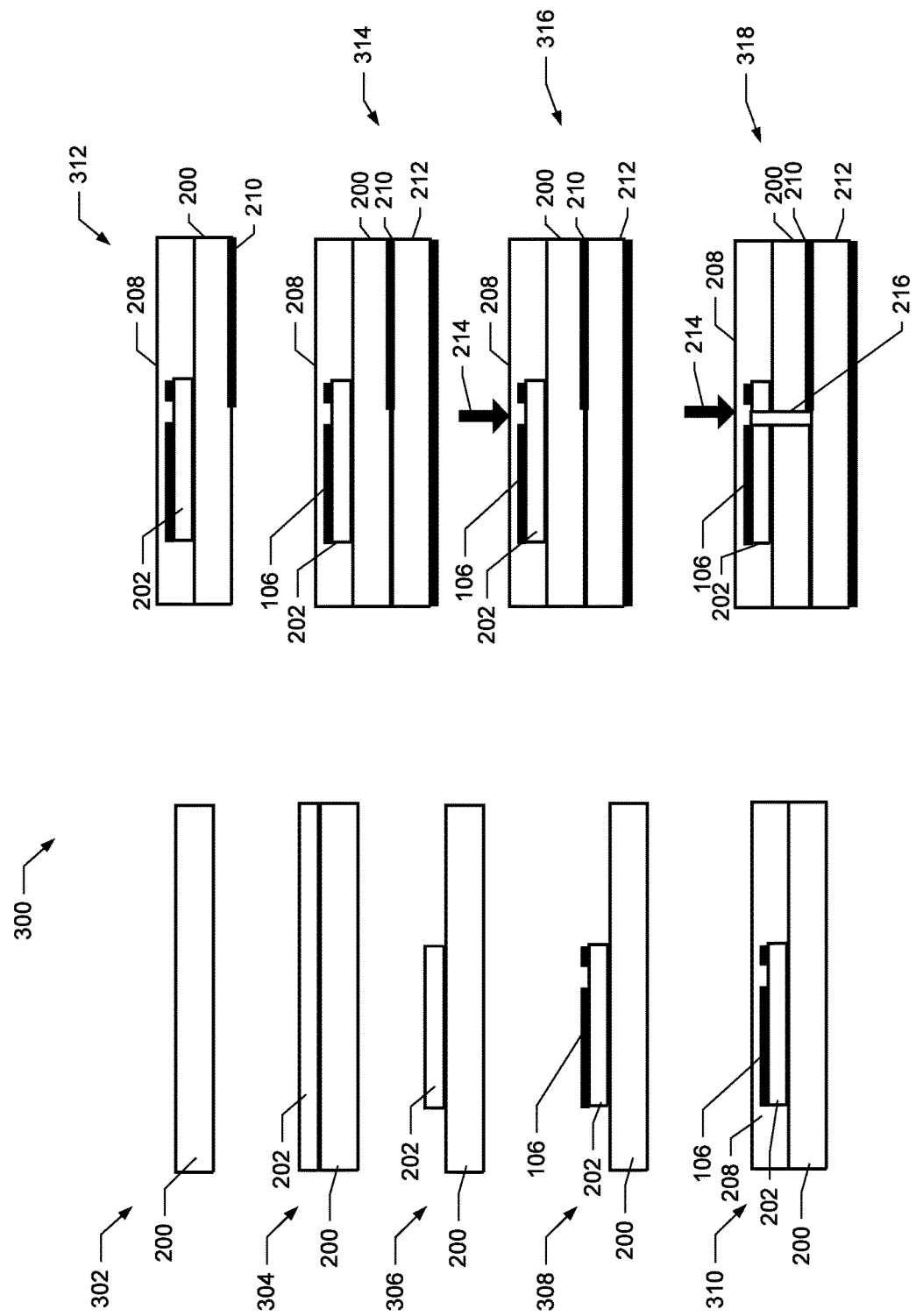
FIG. 4 illustrates a manufacturing process to produce a vertical optically-triggered switch according to one embodiment.

FIG. 4 illustrates one embodiment of a manufacturing process 300 to produce the optically-triggered switch 100. The process 300 begins by providing a substrate 200 at 302. In one embodiment, the substrate 200 is a SiGaN wafer approximately 1 mm thick and approximately 2 inches in diameter. At 304, an epitaxial layer 202 of GaN is grown on the substrate 200. The epitaxial layer 202 may be grown by an HVPE process and extrinsically doped to provide an n+ doped layer approximately 50 μm thick. At 306, the epitaxial layer 202 is etched to provide a mesa structure and conductive contacts or electrodes 106 and 104A-B are bonded to the remaining epitaxial layer at 308. A passivation layer of silicone oxide ($SiO_2$) 208 is bonded to the switch 100 at 310 and at 312, another contact 210 is bonded to the substrate 202 opposite the epitaxial layer 204. The substrate 200 is then bonded to an AlN base layer 212 at 314. At 316, the switch 100 is exposed to a laser 214 which is used to define a switch channel 216, as shown at 318.

In various embodiments, the optically-triggered switch 100 is configured for operation in horizontal and/or vertical bulk avalanche modes. In one embodiment, the optically-triggered switch 100 is approximately 1 mm thick and configured as a 10-25Ω Blumlein pulser. The optically-triggered switch 100 may be triggered by any suitable optical source including, but not limited to, a fiber-coupled Laser diode. Any laser or laser diode with a wavelength compatible with the semiconductor band gap can be used to illuminate the optical switch.

The optically-triggered switch 100 has a projected output of approximately 2.5 to 5 GW which can be derated by a factor of approximately 4 such that each switch may have a derated output of approximately 1 GW. In various other embodiments, switches that can switch power systems on the order of watts to multiple terawatts can also be fabricated using GaN or AlGaN semiconductors. The rise time for various embodiments of the switch 100 is on the order of picoseconds, while the pulse width for the output of the switch 100 may be varied based on the geometry of the switch. Sub picosecond rise times may also be achievable. An impedance mismatch with the switch 100 may cause ring down with the switch. In one embodiment, the switch 100 may have approximately 4-5 ring down cycles. Alternatively, the laser triggered switches can be used in active amplifier circuits such as class E or Class D amplifiers to generate high power RF signals.

In some embodiments, GaN is selected for the epitaxial layer 202 as GaN is highly chemically inert and does not require hermetic packaging. In addition, GaN has low thermal impedance that helps to prevent heat buildup and a thermal resistance approximately two to three times that of copper, which in turn allows for faster cooling of the switch. In some embodiments, the epitaxial layer 202 of the switch 100 may include AlGaN alone or in combination with GaN as both materials show superior optical properties and provide a superior Baliga's figure of merit (BFoM) as shown in FIG. 5. The BFoM is a geometry-independent comparison of materials for power devices. As shown, GaN has a voltage break down that is over ten times greater than that of GaAs or silicon. As such, the GaN-based switches 100 may achieve a peak power 100 to 200 times higher.

Moreover, commonly used silicon or silicon-carbide based semiconductor materials are indirect band gap semiconductors and have limited optical amplification. Therefore, high power systems using silicon-based semiconductor switches typically require large lasers. Conversely, as shown in FIGS. 6A-B, GaN, and alternatively AlGaN, have significantly higher optical amplification. Due to its direct band gap, GaN is suited for avalanche mode switching using reduced laser energies and/or sizes. Laser diodes or any other optical source can be used for triggering which is compatible with the band gap of the AlGaN or GaN material.

Figure 7:
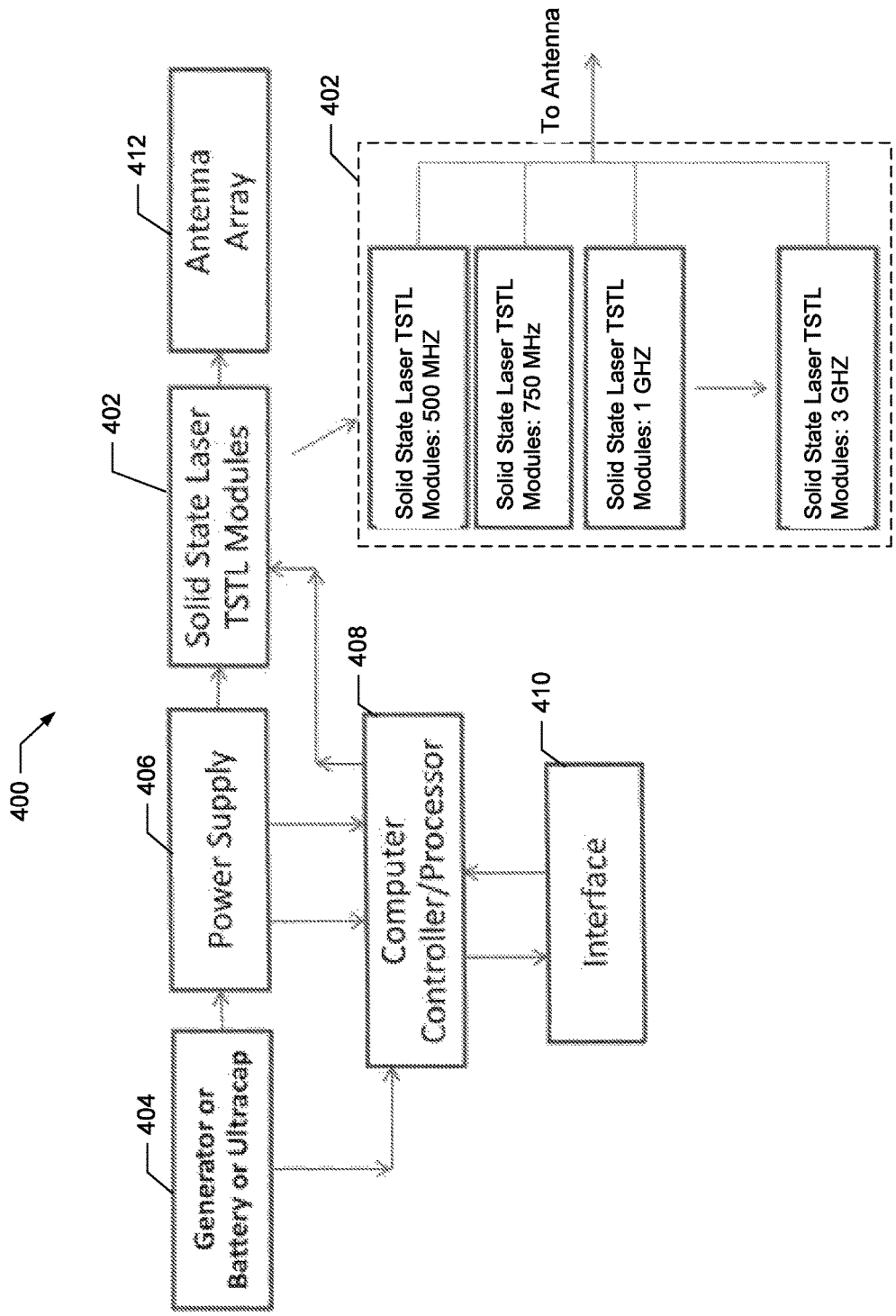
FIG. 7 is a block diagram of a high power system that incorporates modular arrays of the optically-triggered switch according to one embodiment.

One or more of the optically-triggered switches 100 may be arranged into one or more modular arrays configured to provide as much power as desired. For example, the array(s) may be configured to provide 0.5 to 2.0 GW of power or more. FIG. 7 is a block diagram of one embodiment of a compact laser-switched system 400 that includes multiple array modules 402 of the switch 100. The system 400 also includes an energy storage system 404. The energy storage system 404, which may be a generator, a battery, an electrochemical double layer capacitor (an ultracapacitor) or other energy storage device. In one embodiment, operating the system 400 in a burst mode may reduce the average power of the system by storing energy in the energy storage system 404. The energy storage system 404 is in communication with a power supply 406 and a processing device 408 having an interface 410 with which a user may activate, control, or otherwise use the system 400. The processing device 408 is also in communication with the power supply 406; both of which are also in communication with the switch array modules 402. The switch array modules 402 are in further communication with an antenna array 412 having one or more antennas.

The use of multiple switch array modules 402 allows a user of the system 400 to select the frequency generated at the antenna array 412. For example, as shown, each array module 402 may correspond to a particular frequency in a range between approximately 500 MHz and 4 GHz. Modules for frequencies above and below this range may also be used. The modular arrangement of the switch arrays 402 permits each array to be compact in size. In various embodiments, each modular array 402 may be approximately the same size as a shoebox.

Figure 8:
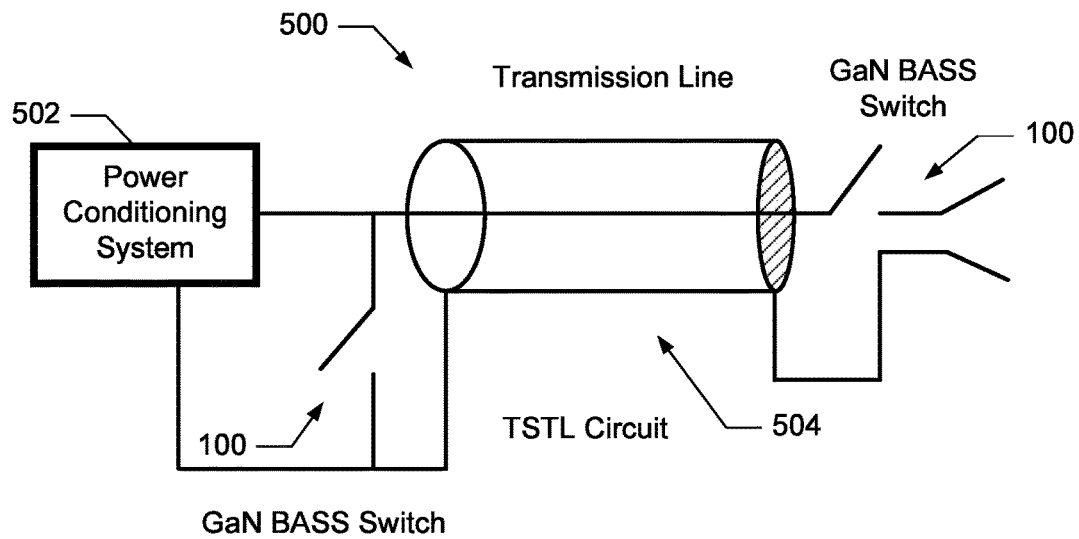
FIG. 8 is a block diagram of a high power TSTL circuit geometry for monocycle generation that incorporates the optically-triggered switch according to one embodiment.

In another embodiment, one or more optically-triggered switches 100 may be used in systems employing a translationally symmetric transmission line (TSTL) circuit geometry for monocycle generation. For example, the switches 100 may be used in a limiter circuit 500 (e.g. a large area radar limiter circuit), as shown in FIG. 8. The circuit 500 may include a power conditioning system 502 in communication with two or more optically-triggered switches 100 through symmetric transmission lines 504.

Figure 9A:
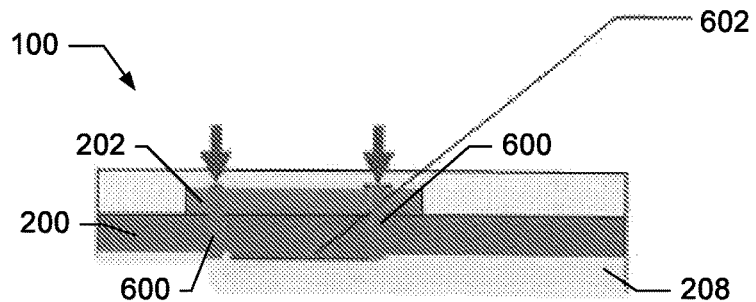
FIG. 9A depicts an embodiment of the optically-triggered switch that may be used in a TSTL pulse forming network.
Figure 9B:
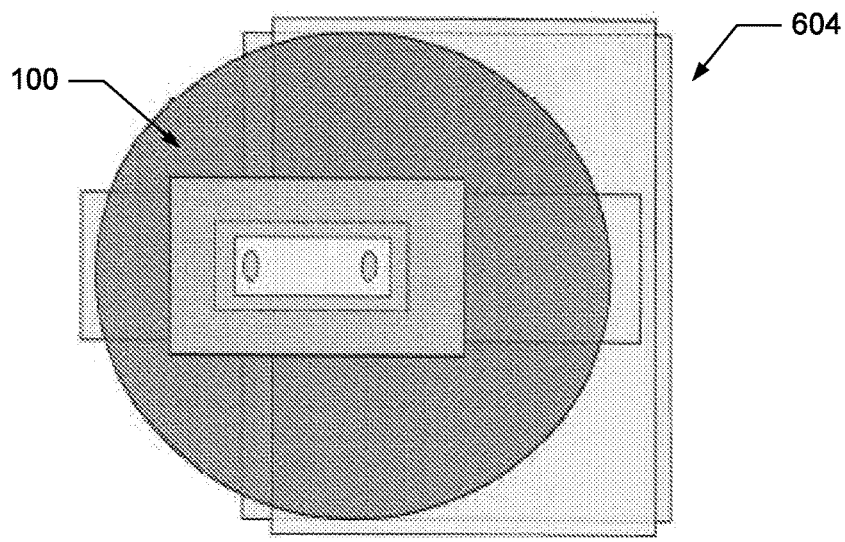
FIG. 9B depicts an embodiment of the optically-triggered switch that may be used in high voltage insulation.

As shown in FIGS. 9A-B, another embodiment of the optically-triggered switch 100 may be integrated into a TSTL pulse forming network. As shown in FIG. 9A, the switch 100 may have dual switch channels 600 that extend though the epitaxial layer 202 to the base layer 208. A path 602 between the channels may be formed by AlN ceramic glue. By way of example, the switch 100 may be integrated into high voltage insulation 604 as shown in FIG. 9B. In another example, the switch 100 may be incorporated into ruggedized package that is triggered by a high power laser diode, a tripled yttrium alexandrite garnet laser, or other laser device.

In a wide variety of solid state laser triggered switched systems that can incorporate the switch 100, including those shown in FIGS. 5-9B, the peak power output increased and may be in a range between approximately 1 GW and 100 GW with an average power in a range between approximately 1 KW and 1 GW. The systems may output power at a frequency between about 10 KHz and 20 KHz; however the output may be rep-rate dependent as a burst mode of operation may reduce the average power output. The systems may generate a signal having an effective radiated power or equivalent radiated power (ERP) between about 100 GW and 10 TW or may boost the gain for antenna by approximately 20 to 30 dB or higher.

Figure 10A:
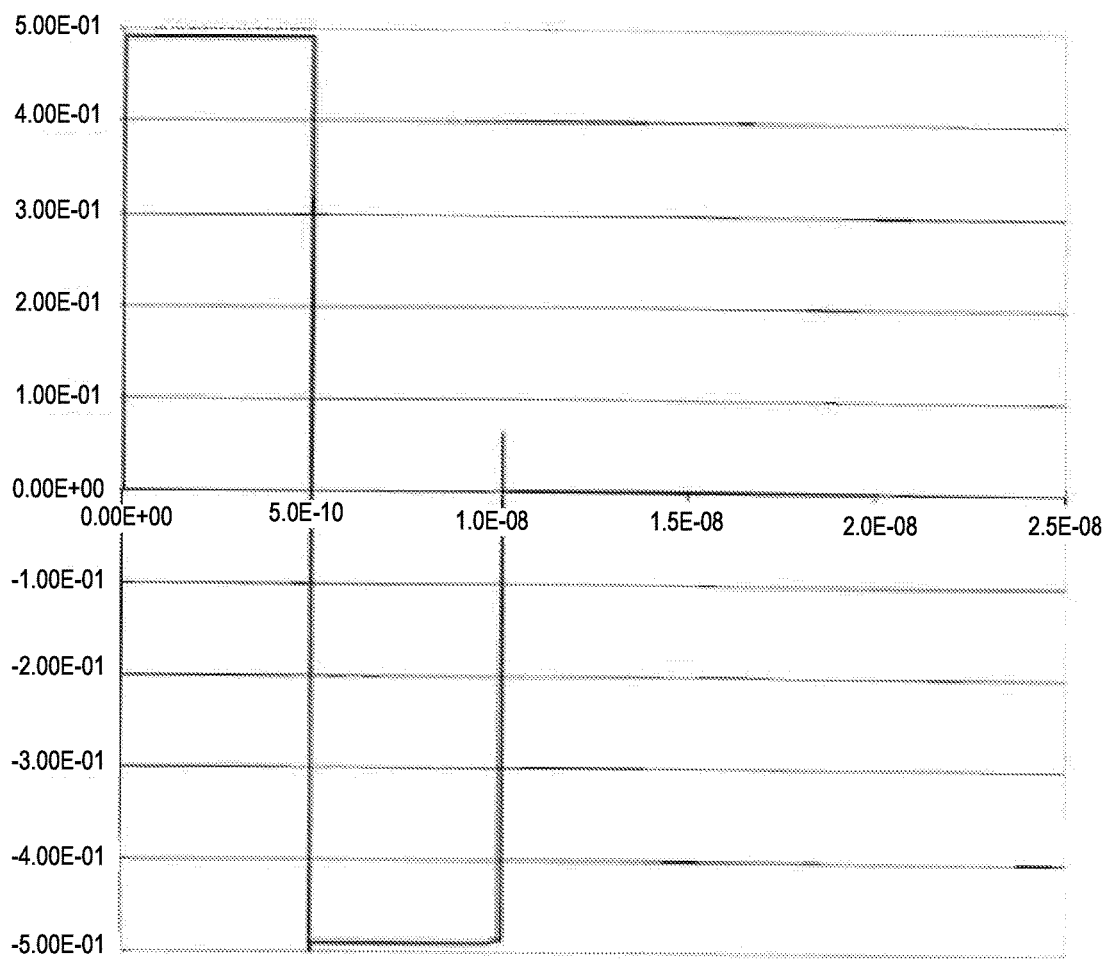
FIGS. 10A-B are graphs illustrating that the waveshape and the number of cycles, respectively, can be tailored to the desired application according to one embodiment.
Figure 10B:
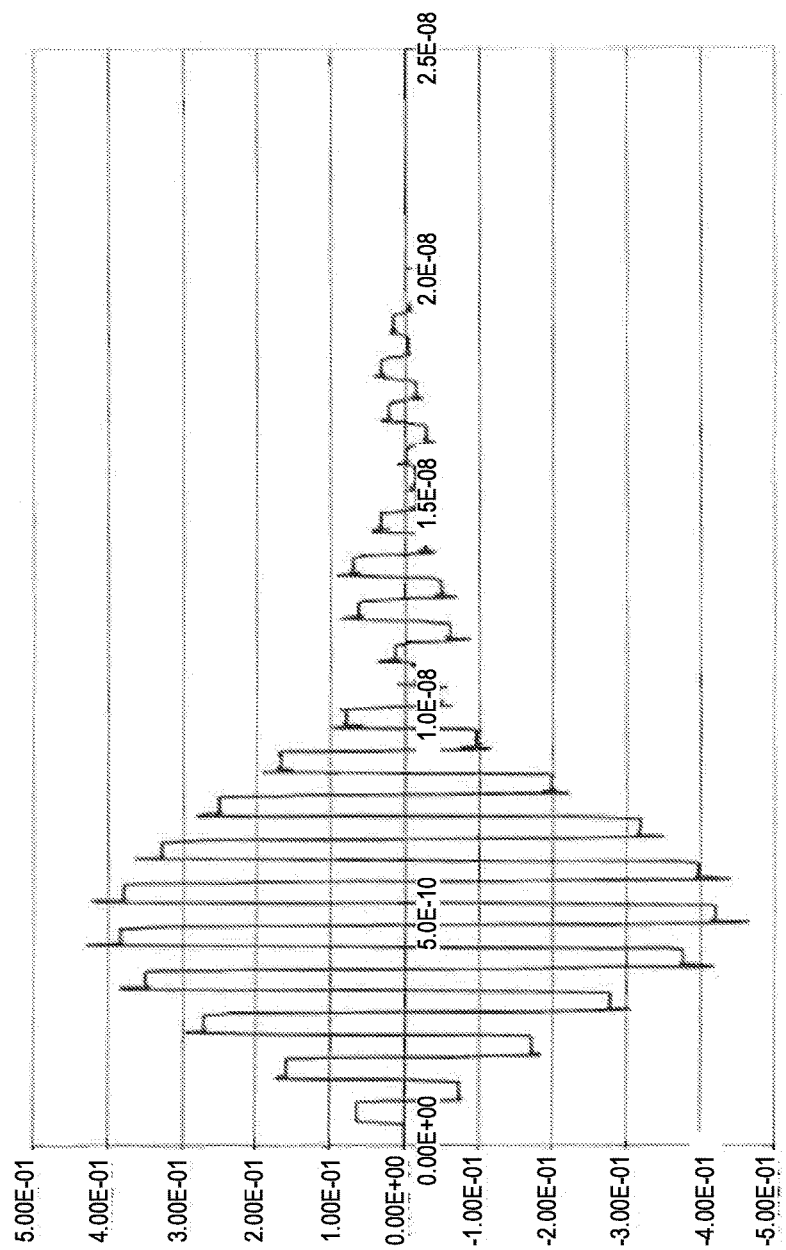

Regarding the output signal, the systems may be frequency agile such that the frequency may be adjustable and in a range between approximately 500 MHz and 3 GHz. In various embodiments, the frequency of the output signal may be modified or tailored to various desired targets and concept of operations (CONOP) scenarios. As shown in FIGS. 10A-B, the waveshape and the number of cycles can be tailored to the desired application. As such, a narrowband frequency signal may be generated.

As previous described, the switch 100 may permit reductions in size of various high power systems. For example, the systems may be compact and housed in rugged and robust housings approximately the size of a shoebox. The solid state systems may be configured to be waterproof or water resistant, drop or shock resistant, and suitable for operational temperatures up to, but not limited to, approximately 200° C.

Similarly, the weight of the systems may be reduced. In various aspects, the weight of the systems may depend on the desired rep-rate of the system. For example, the systems may be less than approximately 200 pounds, and may even weigh 20 pounds or less. Low rep-rate systems may be very compact and portable by one or two people. The size and weight of the systems may also be may be modified or tailored to various desired targets and CONOP scenarios.

In various embodiments, the frequency, power, and rep-rate of the output signal as well as the weight of the system or device may be configured and varied with gains in one parameter being made for losses in another. For example, one system may be modified to generate a first output signal at a frequency of 500 MHz, for 5 cycles at a power of 1 GW and 1 KHz with an average power of 20 kW. The same system may be easily and dynamically modified to generate an output signal for 5 cycles at a power of 1 GW and 100 Hz with an average power of 2 kW.

It will be appreciated that the device and method of the present invention are capable of being incorporated in the form of a variety of embodiments, only a few of which have been illustrated and described above. The invention may be embodied in other specific forms without departing from its spirit or essential characteristics. The described embodiments are to be considered in all respects only as illustrative and not restrictive and the scope of the invention is, therefore indicated by the appended claims rather than by the foregoing description. All changes which come within the meaning and range of equivalency of the claims are to be embraced within their scope.

What is claimed is:

1. A modular laser-switched system comprising:
   an optically-triggered switch array module, the array module comprising at least one optically-triggered switch, wherein the at least one optically-triggered switch further comprises:
   a substrate;
   a semiconductor material having a top surface and a bottom surface,
      wherein the bottom surface is connected to the substrate;
   one or more conductive contacts connected to the top surface of the semiconductor material;
   one or more grounding electrodes connected to a substrate bottom surface; and
   wherein, the semiconductor material undergoes an avalanche breakdown providing a conductive region therein, when contacted by an optical signal;
   an energy storage system;
   a power supply connected with the energy storage system and the optically-triggered switch array module;
   a processing device comprising at least one processor and a user interface, the processing device connected with the energy storage system, the power supply, and the optically-triggered switch array module; and
   an antenna array comprising one or more antennas, wherein the antenna array is connected with the optically-triggered switch array module.

2. The modular laser-switched system of claim 1, wherein the optically-triggered switch array module further comprises a plurality of optically-triggered switches, wherein each of the optically-triggered switches is corresponds to a particular frequency in a range between about 500 MHz and about 4 GHz.

3. The modular laser-switched system of claim 1, wherein the energy storage system is a generator, a battery, an electrochemical double layer capacitor, an ultracapacitor, or combinations thereof.

4. The modular laser-switched system of claim 1, wherein the system operates in a burst mode.

5. The modular laser-switched system of claim 1, wherein the optically-triggered switch array module has dimensions approximately equal to that of a shoebox.

6. The switch of claim 1 configured to operate when exposed to a voltage potential in a range from approximately 0.01V to approximately 10 MV.

7. A limiter circuit comprising:
   an optically-triggered switch array module, the array module comprising at least one optically-triggered switch, wherein the at least one optically-triggered switch further comprises:
   a substrate;
   a semiconductor material having a top surface and a bottom surface, wherein the bottom surface is connected to the substrate;
   one or more conductive contacts connected to the top surface of the semiconductor material;
   one or more grounding electrodes connected to a substrate bottom surface; and
   wherein, the semiconductor material undergoes an avalanche breakdown providing a conductive region therein, when contacted by an optical signal;
   a power conditioning system; and
   a dual switch circuit comprising symmetric transmission lines.

8. The switch of claim 7 configured to operate when exposed to a voltage potential in a range from approximately 0.01V to approximately 10 MV.

9. A dual switch pulse forming device comprising:
   at least one optically-triggered switch, wherein the at least one optically-triggered switch further comprises:
   a substrate;
   a base layer connected to the substrate at an interface;
   a semiconductor material having a top surface and a bottom surface,
      wherein the bottom surface is connected to the substrate;
   one or more conductive contacts connected to the top surface of the semiconductor material;
   one or more grounding electrodes connected to a substrate bottom surface;
   two or more switch channels formed in the substrate and semiconductor material, the two or more switch channels extending from the one or more conductive contacts to the one or more grounding electrodes; and
   wherein, the semiconductor material undergoes an avalanche breakdown providing a conductive region therein, when contacted by an optical signal.

10. The device of claim 9 further comprising high voltage insulation.

11. The device of claim 9 wherein the semiconductor material is contacted by a laser diode or a tripled yttrium alexandrite garnet laser.

12. The switch of claim 9 configured to operate when exposed to a voltage potential in a range from approximately 0.01V to approximately 10 MV.

13. A modular laser-switched system comprising:
   an optically-triggered switch array module, the array module comprising at least one optically-triggered switch, wherein the at least one optically-triggered switch further comprises:
   at least one semiconductor material comprising nitride;
   a plurality of conductive contacts connected to the semiconductor material;
   a plurality of grounding electrode pairs connected to the semiconductor material, wherein a portion of the semiconductor material separates each grounding electrode of the plurality of grounding electrode pairs from a conductive contact of the plurality of conductive contacts the at least one conductive contact; and,
   wherein the semiconductor material undergoes an avalanche breakdown providing a conductive region therein when contacted by an optical signal;
   an energy storage system;
   a power supply connected with the energy storage system and the optically-triggered switch array module;

a processing device comprising at least one processor and a user interface, the processing device connected with the energy storage system, the power supply, and the optically-triggered switch array module; and an antenna array comprising one or more antennas, wherein the antenna array is connected with the optically-triggered switch array module.

14. The switch of claim 13 configured to operate when exposed to a voltage potential in a range from approximately 0.01V to approximately 10 MV.

15. A limiter circuit comprising:

an optically-triggered switch array module, the array module comprising at least one optically-triggered switch, wherein the at least one optically-triggered switch further comprises:

at least one semiconductor material comprising nitride;

a plurality of conductive contacts connected to the semiconductor material;

a plurality of grounding electrode pairs connected to the semiconductor material, wherein a portion of the semiconductor material separates each grounding electrode of the plurality of grounding electrode pairs from a conductive contact of the plurality of conductive contacts the at least one conductive contact; and, wherein the semiconductor material undergoes an avalanche breakdown providing a conductive region therein when contacted by an optical signal;

a power conditioning system; and dual switch circuit comprising symmetric transmission lines.

16. A dual switch pulse forming device comprising:

at least one optically-triggered switch, wherein the at least one optically-triggered switch further comprises:

at least one semiconductor material comprising nitride;

a base layer connected to the substrate at an interface;

a plurality of conductive contacts connected to the semiconductor material;

a plurality of grounding electrode pairs connected to the semiconductor material, wherein a portion of the semiconductor material separates each grounding electrode of the plurality of grounding electrode pairs from a conductive contact of the plurality of conductive contacts the at least one conductive contact;

two or more switch channels formed in the substrate and semiconductor material, the two or more switch channels extending from the one or more conductive contacts to the one or more grounding electrodes; and wherein, the semiconductor material undergoes an avalanche breakdown providing a conductive region therein, when contacted by an optical signal.

* * * * *